(12) United States Patent
Moloudi

(10) Patent No.: US 6,801,092 B1
(45) Date of Patent: Oct. 5, 2004

(54) PHASE LOCKED LOOP THAT AVOIDS FALSE LOCKING

(75) Inventor: Shervin Moloudi, Los Angeles, CA (US)

(73) Assignee: Broadcom Corp., Irvine, CA (US)

(*) Notice: Subject to any disclaimer, the term of this patent is extended or adjusted under 35 U.S.C. 154(b) by 16 days.

(21) Appl. No.: 10/409,213

(22) Filed: Apr. 8, 2003

(51) Int. Cl.[7] ................................................. H03L 7/00
(52) U.S. Cl. ........................... 331/16; 331/11; 332/128
(58) Field of Search ........................... 331/16, 11, 14, 331/41, 44, 74, 30; 455/255, 258; 322/128; 375/219, 326

(56) References Cited

U.S. PATENT DOCUMENTS

| | | | | |
|---|---|---|---|---|
| 4,297,650 A | * | 10/1981 | Shinmyo | 331/11 |
| 4,882,549 A | * | 11/1989 | Galani et al. | 331/14 |
| 5,019,790 A | * | 5/1991 | Kapetanic | 331/16 |
| 5,952,895 A | * | 9/1999 | McCune et al. | 332/128 |
| 6,094,463 A | * | 7/2000 | Stephens et al. | 375/326 |
| 2001/0048715 A1 | * | 12/2001 | Lee et al. | 375/219 |

\* cited by examiner

*Primary Examiner*—Robert Pascal
*Assistant Examiner*—Joseph Chang
(74) *Attorney, Agent, or Firm*—Timothy W. Markison

(57) ABSTRACT

A phase locked loop includes a difference detector, a loop filter, a controlled oscillation module, and a frequency translation module. The difference detector is operably coupled to determine a difference signal based on phase and/or frequency differences between a feedback oscillation and a reference oscillation. The loop filter is operably coupled to generate a control signal from the difference signal. The controlled oscillation module is operably coupled to produce, in accordance with an adjustable operating parameter, an output oscillation based on the controlled signal. The adjustable operating parameter is set based on desired operating conditions of the phase locked loop such that false locking of the phase locked loop is substantially avoided. The frequency translation module is operably coupled to produce the feedback oscillation from the output oscillation based on a frequency translation rate.

42 Claims, 14 Drawing Sheets prior art PLL prior art PLL image issue prior art sollution to image issue local oscillation module 74 frequency translation module 108 frequency translation module 108 frequency translation module 108

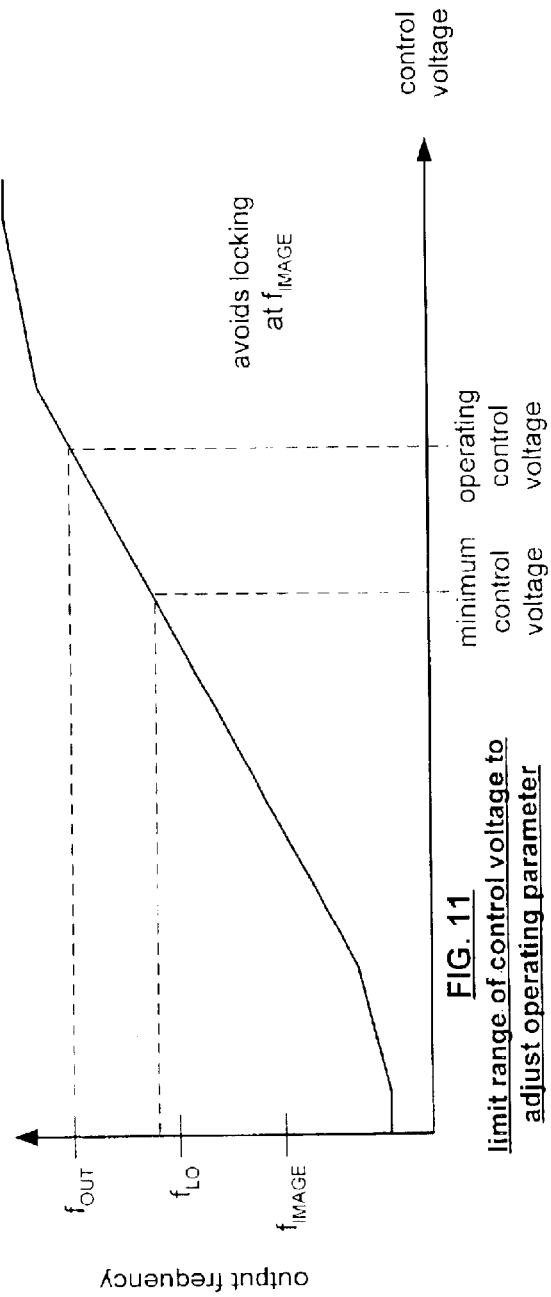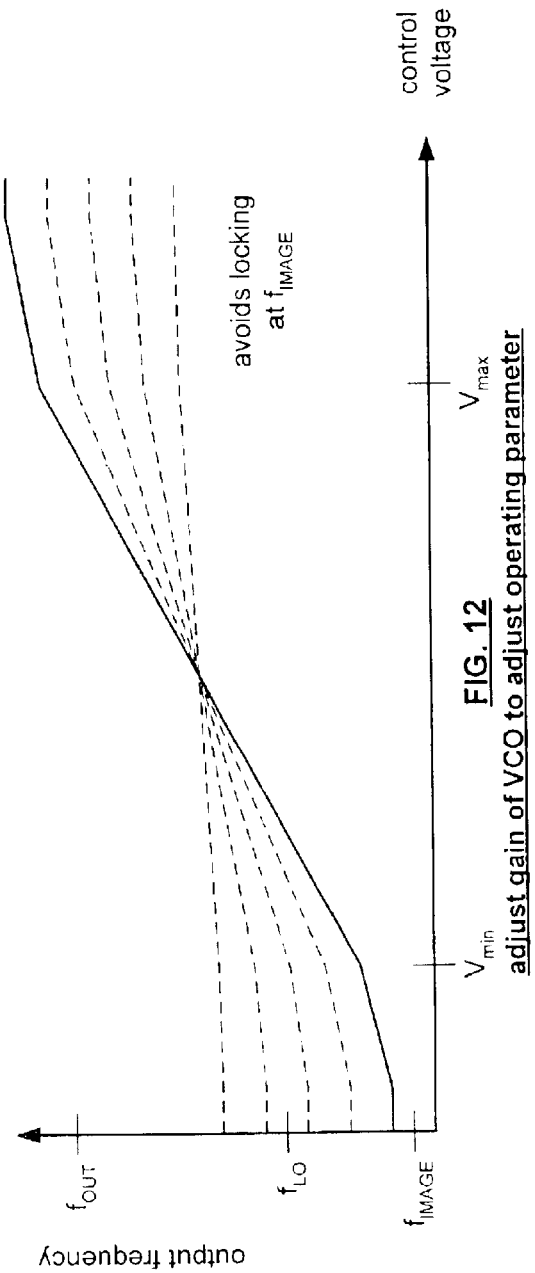

adjust bias level of VCO to adjust operating parameter local oscillation module 74

Phase Shift Keying modulator 200

Phase Shift Keying modulator 200

VCO 106 or 206

VCO 106 or 206

PHASE LOCKED LOOP THAT AVOIDS FALSE LOCKING

BACKGROUND OF THE INVENTION

1. Technical Field

This invention relates generally to mixed signal circuitry and more particularly to phase locked loops.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

FIG. 1 is a schematic block diagram of a prior art phase locked loop. The phase locked loop includes a phase and frequency detector, a charge pump, a loop filter, a voltage controlled oscillator (VCO) and a feedback divider, which may be a fractional-N feedback divider. The phase and frequency detector determines a difference between the phase and/or frequency of a reference oscillation and a feedback oscillation. The charge pump converts the difference signal into a current, which is subsequently converted into a control voltage via the loop filter. The voltage controlled oscillator, based on the control voltage, generates the output oscillation. The feedback divider divides the output oscillation by a divider value (N) to produce the feedback oscillation. As such, in steady state conditions, the output oscillation equals the reference oscillation times the divider value (N).

FIG. 1 further illustrates the output oscillation in the frequency domain to be centered at the output frequency ($f_{OUT}$). As shown, based on the reference oscillation changing, and/or the divider value changing, the frequency spectrum of the output oscillation has a general shape as shown. The feedback divider divides the output oscillation by the divider value to produce the feedback oscillation. In addition to dividing the frequency by the divider value N, the feedback divider also divides the frequency spectrum of the output oscillation by N thereby producing the narrower frequency spectrum centered at the feedback frequency ($f_{FB}$).

As shown, the frequency spectrum of the feedback oscillation is compressed with respect to the frequency spectrum of the output oscillation. As such, the phase and frequency detector may lose zero crossings due to the narrower spectrum of the feedback oscillation. When the phase and/or frequency detector loses zero crossings, compensation of the entire loop is adversely effected causing the phase locked loop to have poor frequency tracking, which is a significant problem for radios and other high performance electronic equipment.

FIG. 2 is a schematic block diagram of an alternate prior art phase locked loop that includes the phase and frequency detector, the charge pump, the loop filter and the voltage controlled oscillator. In place of the feedback divider, the phase locked loop of FIG. 2 includes a frequency translator. The frequency translator includes a mixer and a local oscillation wherein the output of the mixer provides the feedback oscillation and corresponds to the difference between the output oscillation ($f_{OUT}$) and the local oscillation frequency ($f_{LO}$). In this embodiment, the feedback oscillation has the same spectrum width as the output oscillation. However, the phase locked loop is subject to false locking on an image frequency of the output frequency and local oscillation.

FIG. 3 is a graphical representation of the false locking issue of the phase locked loop of FIG. 2. In this illustration, the desired output oscillation has a frequency at ($f_{OUT}$). The local oscillation has a frequency of ($f_{LO}$). Accordingly, the difference between the output oscillation and the local oscillation corresponds to the reference oscillation, which corresponds to the frequency of the feedback oscillation.

However, due to the frequency translation nature of a mixer, an image frequency is also generated which corresponds to the local oscillation frequency less the difference between the output oscillation frequency and the local oscillation frequency. As such, as the phase locked loop of FIG. 2 is approaching steady state condition, the output oscillation is increasing from a lower frequency to a higher frequency. Once the output oscillation reaches the frequency that corresponds to the image frequency ($f_{IMAGE}$), the phase locked loop locks at this frequency if the VCO is not saturated at this frequency. As such, the desired output oscillation is never achieved.

FIG. 4 illustrates one solution for avoiding the phase locked loop of FIG. 2 falsely locking at the image frequency. In this solution, the difference between the frequency of the local oscillator and the frequency of the desired output oscillation is increased to a range such that the local oscillation frequency is outside of the bandwidth of the VCO. As such, as the output oscillation is increasing, when it hits the image frequency, the voltage controlled oscillator is still outside of its linear range of operation, (i.e., is saturated in the full on mode) such that the phase locked loop does not lock at the image frequency. While this avoids false locking, it presents many issues for high frequency operations. In particular, using crystal reference oscillators above approximately 20–25 megahertz substantially increases the cost of such phase locked loops. In addition, if the phase locked loop is implemented in CMOS technology, it is difficult to produce a reliable high frequency phase and frequency detector that operates above a 100 megahertz.

Therefore, a need exists for a phase locked loop that avoids false locking while allowing conventional and economical components to be used.

BRIEF SUMMARY OF THE INVENTION

The phase locked loop that avoids false locking of the present invention substantially meets these needs and others. In one embodiment, a phase locked loop includes a difference detector, a loop filter, a controlled oscillation module, and a frequency translation module. The difference detector is operably coupled to determine a difference signal based on phase and/or frequency differences between a feedback oscillation and a reference oscillation. The difference signal corresponds to the phase and/or frequency difference between the feedback oscillation and the reference oscillation. The loop filter is operably coupled to generate a control signal from the difference signal. The controlled oscillation module is operably coupled to produce, in accordance with an adjustable operating parameter, an output oscillation based on the controlled signal. For example, the control signal may be a voltage controlled signal where the controlled oscillation module is a voltage controlled oscillator. The adjustable operating parameter is set based on desired operating conditions of the phase locked loop such that false locking of the phase locked loop is substantially avoided. The frequency translation module is operably coupled to produce the feedback oscillation from the output oscillation based on a frequency translation rate.

In another embodiment, a phase locked loop includes a difference detector, a loop filter, a controlled oscillation module, a frequency translation module, and a divider module. The difference detector produces a difference signal based on phase and/or frequency differences between a feedback oscillation and a reference oscillation. The loop filter converts the difference signal into a control signal. The controlled oscillation module produces an output oscillation based on the control signal. The frequency translation module and the divider module, in combination, produce an intermediate feedback oscillation from the output oscillation and then produce the feedback oscillation from the intermediate feedback oscillation. The intermediate feedback oscillation is of a frequency, with respect to the reference oscillation and the output oscillation, to substantially avoid false locking of the phase locked loop.

The phase locked loop of the present invention may be used in a variety of applications. For example, the phase locked loop may be included in a phase shift keying (PSK) modulator that includes a modulation module to mix data with the translation oscillation to produce the feedback oscillation. Further, the phase locked loop and/or the PSK modulator may be used in a radio frequency integrated circuit.

BRIEF DESCRIPTION OF THE SEVERAL VIEWS OF THE DRAWINGS

FIG. 11 is a graphical representation of limiting the range of a control voltage to adjust the operating parameter of the controlled oscillator in accordance with the present invention;

FIG. 12 is a graphical representation of adjusting the gain of a voltage controlled oscillator to adjust the operating parameter in accordance with the present invention;

DETAILED DESCRIPTION OF THE INVENTION

Figure 5:
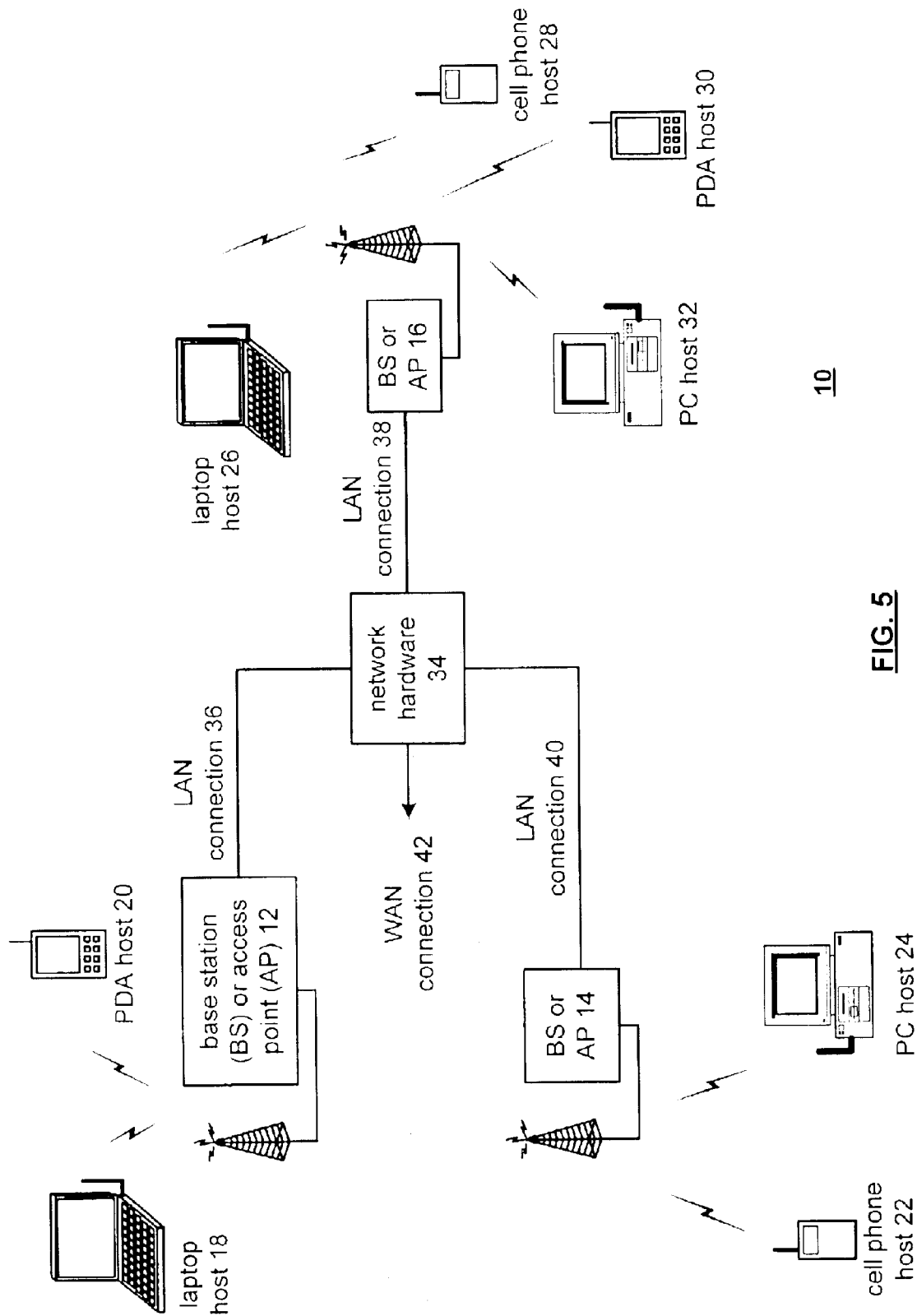
FIG. 5 is a schematic block diagram of a wireless communication system in accordance with the present invention.

FIG. 5 is a schematic block diagram illustrating a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 6.

The base stations or access points 12–16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 6:
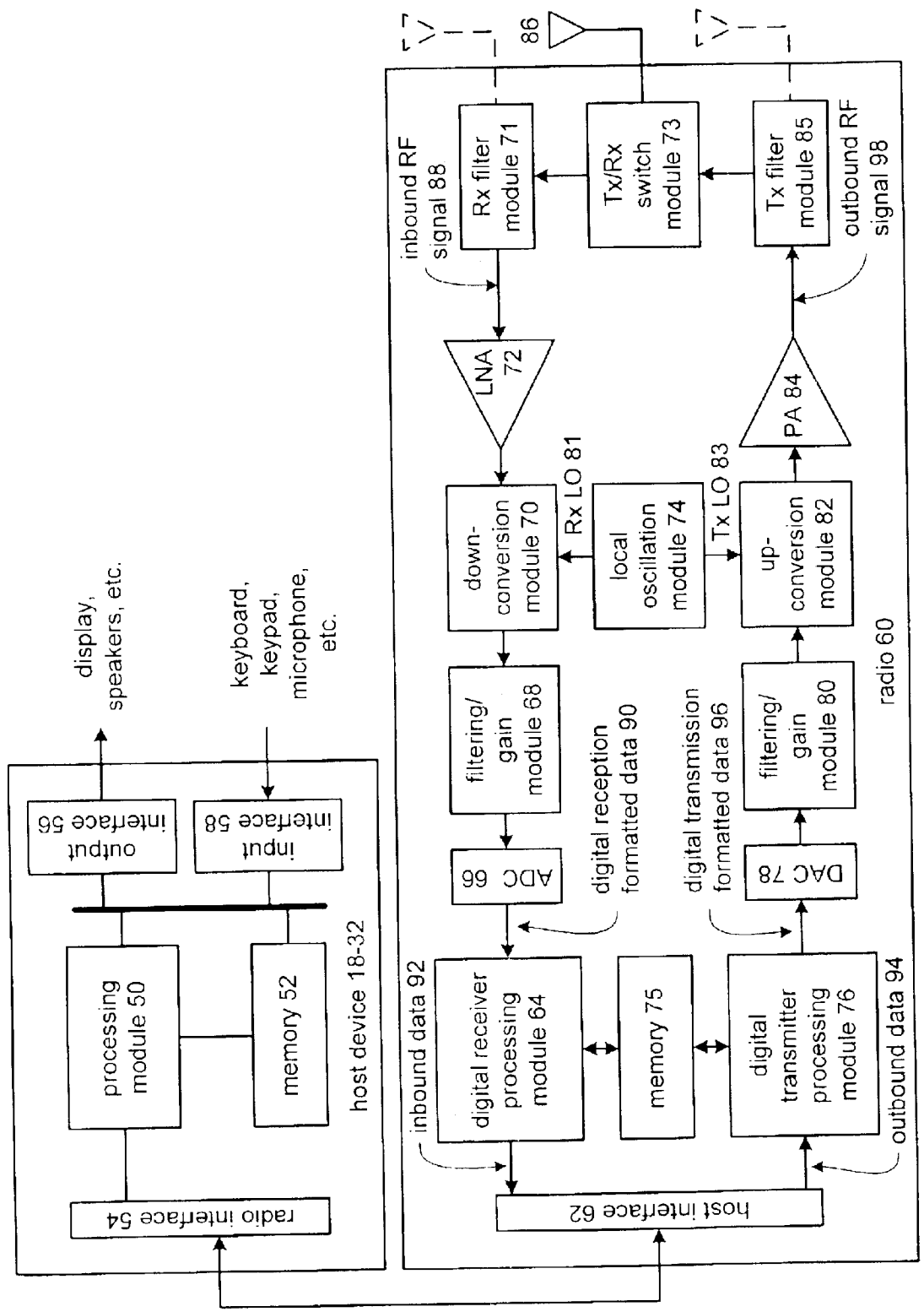
FIG. 6 is a schematic block diagram of a wireless communication device in accordance with the present invention.

FIG. 6 is a schematic block diagram illustrating a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/attenuation module 68, an IF mixing down conversion stage 70, a receiver filter 71, a low noise amplifier 72, a transmitter/receiver switch 73, a local oscillation module 74, memory 75, a digital transmitter processing module 76, a digital-to-analog converter 78, a filtering/gain module 80, an IF mixing up conversion stage 82, a power amplifier 84, a transmitter filter module 85, and an antenna 86. The antenna 86 may be a single antenna that is shared by the transmit and receive paths as regulated by the Tx/Rx switch 73, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 directly converts the analog baseband or low IF signal into an RF signal based on a transmitter local oscillation 83 provided by local oscillation module 74, which may be implemented in accordance with the teachings of the present invention. The power amplifier 84 amplifies the RF signal to produce outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 73, where the Rx filter 71 bandpass filters the inbound RF signal 88. The Rx filter 71 provides the filtered RF signal to low noise amplifier 72, which amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74, which may be implemented in accordance with the teachings of the present invention. The down conversion module 70 provides the inbound low IF signal or baseband signal to the filtering/gain module 68. The filtering/gain module 68 filters and/or gains the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

As one of average skill in the art will appreciate, the wireless communication device of FIG. 6 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 7:
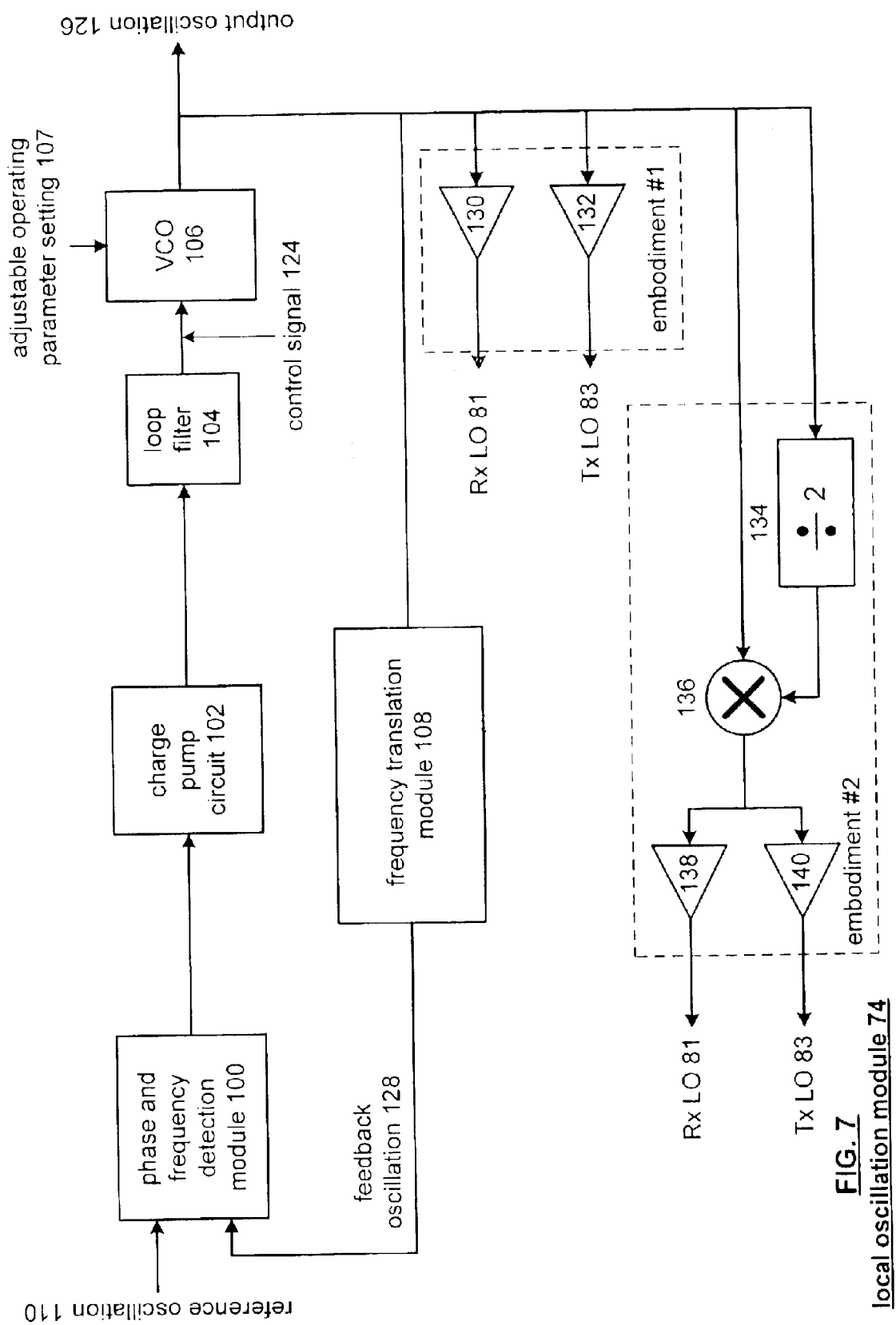
FIG. 7 is a schematic block diagram of a local oscillation module in accordance with the present invention.

FIG. 7 is a schematic block diagram of a local oscillation module 74. The local oscillation module 74, which has a phase locked loop topology, includes a phase and frequency detection module 100, charge pump circuit 102, loop filter 104, adjustable voltage controlled oscillator (VCO) 106, and a frequency translation module 108. The phase and frequency detection module 100 produces a difference signal based on phase and/or frequency differences between a reference oscillation 110 and a feedback oscillation 128. A crystal oscillator that produces a 10–25 megahertz reference oscillation may provide the reference oscillation 110. The charge pump 102 converts the difference signal into a current that is provided to loop filter 104. Loop filter 104 converts the current signal into the control signal 124. Based on the control signal 124 and the corresponding adjustable operating parameter setting 107, the voltage controlled oscillator (VCO) 106 produces the output oscillation 126. By setting the operating parameters of the VCO at particular levels, the phase locked loop topology of local oscillation module 74 avoids false locking at image frequencies. The adjustment of the operating parameters of the voltage controlled oscillator will be described in greater detail with reference to FIGS. 11–13, 17 and 18.

The frequency translation module 108 converts the output oscillation 126 into the feedback oscillation 128. Various embodiments of the frequency translation module 108 will be described with reference to FIGS. 8–10.

To produce the local oscillation for the receiver 81 and for the transmitter 83, various embodiments may be utilized. As shown in embodiment 1, two buffers 130 and 132 may be used to produce the local oscillators for the receiver and transmitter sections. Alternatively, as shown in embodiment 2, the output oscillation 126 may be divided by a divider 134 and then mixed with a mixer 136. The output of mixer 136 is then buffered via buffer 138 and 140 to produce the corresponding local oscillations for the receiver and transmitter. In embodiment 2, the resulting receiver and transmitter local oscillations 81 and 83 are 1½ times the frequency of the output oscillation 126. By generating the receiver and transmitter local oscillations in this manner, adverse effects, such as DC offset, local oscillation leakage, et cetera are substantially avoided for direct conversion transceivers.

As one of average skill in the art will appreciate, the voltage controlled oscillator may be replaced with a current controlled oscillator such that the control signal 124 corresponds to a current signal.

Figure 8:
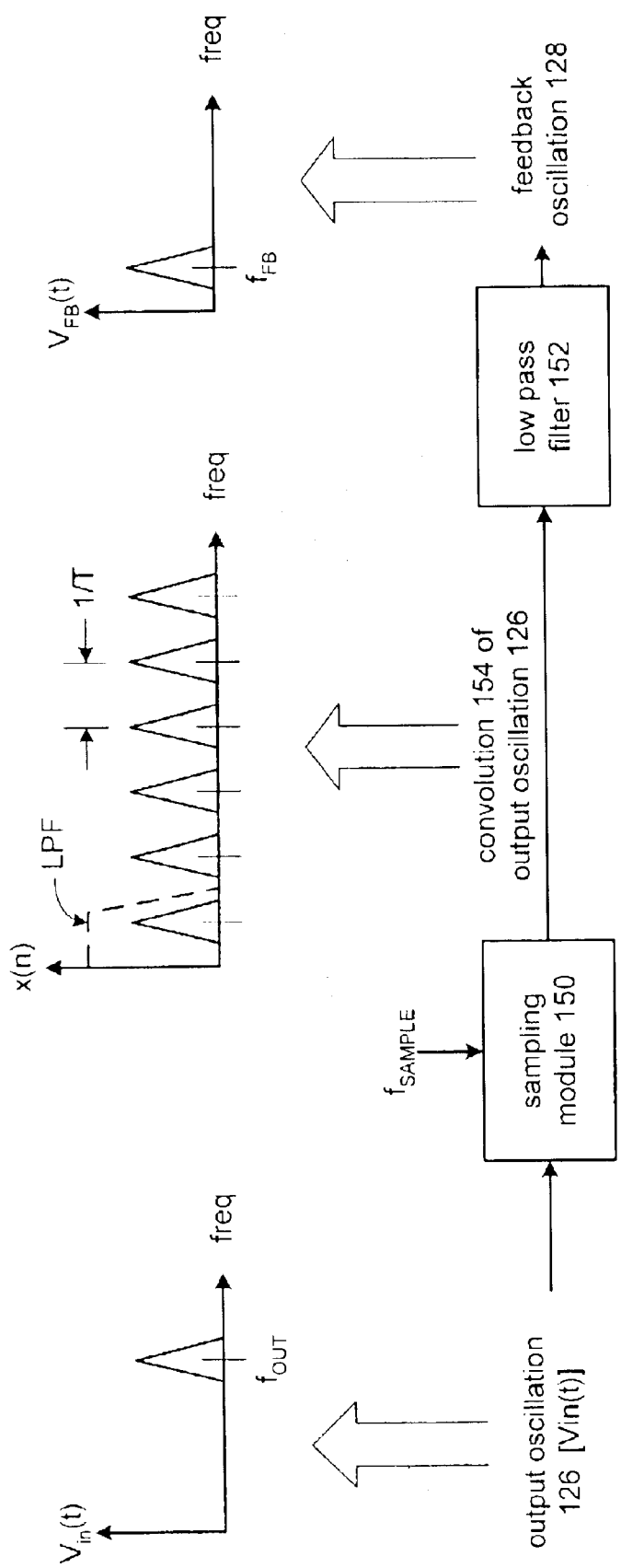
FIG. 8 is a schematic block diagram of a frequency translation module in accordance with the present invention.

FIG. 8 is a schematic block diagram of an embodiment of the frequency translation module 108 configured as a sub-sampling mixer. In this embodiment, the output oscillation 126 is sampled at a sampling rate ($F_{SAMPLE}$) to produce a convolutional output 154 of the output oscillation 126. A low pass filter 152 filters the convolution output 154 to produce the feedback oscillation 128. The corresponding frequency domain representations of the output oscillation 126, the convolution output 154, and the feedback oscillation 126 are also illustrated in FIG. 8.

As shown, the output oscillation 126 has a frequency spectrum centered around the output frequency ($f_{OUT}$). Based on the sampling rate, which corresponds to 1/T in the frequency domain representation of the convolutional output 154, the frequency spectrum of the output oscillation is repeated from near zero frequency to infinity. The low pass filter (LPF) filters all but the lowest frequency representation of the convolutional output 154 thereby yielding the feedback oscillation 128 that has a frequency domain representation centered about the frequency of the feedback ($f_{FB}$).

Figure 9:
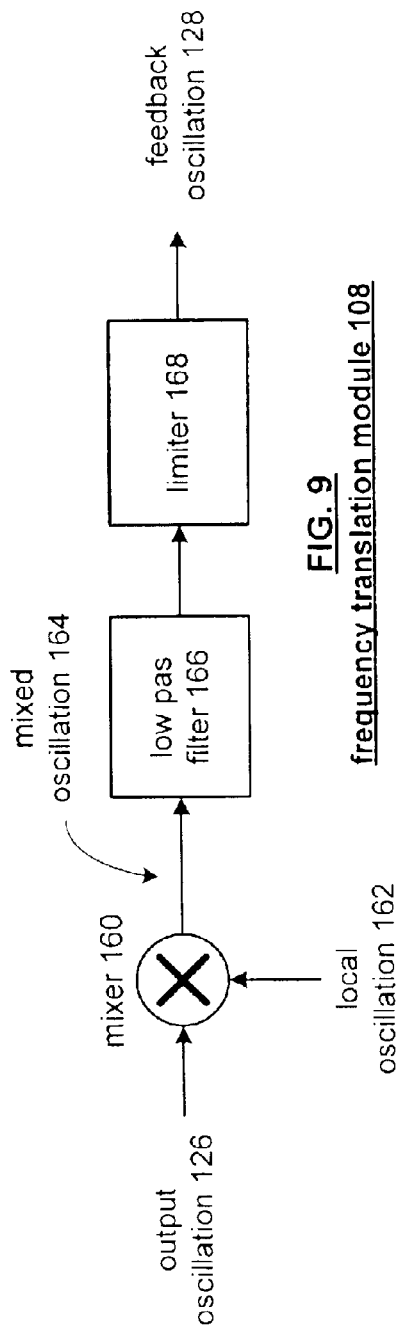
FIG. 9 is a schematic block diagram of an alternate frequency translation module in accordance with the present invention.

FIG. 9 is a schematic block diagram of another embodiment of the frequency translation module 108. In this embodiment, the frequency translation module 108 includes mixer 160, low pass filter 166, and limiter 168. The mixer 160 mixes the output oscillation 126 with a local oscillation 162 to produce a mixed oscillation 164. The mixer 160 may be a single side band mixer such that the mixed signal oscillation 164 corresponds to the frequency of the output oscillation less the frequency of the local oscillation.

The low pass filter 166 filters the mixed oscillation 164. The limiter 168 limits (e.g., produces a rail-to-rail representation) the filtered mixed oscillation 164 to produce the feedback oscillation 128. Note that the local oscillation corresponds to the frequency translation rate of the frequency translation module 108.

Figure 10:
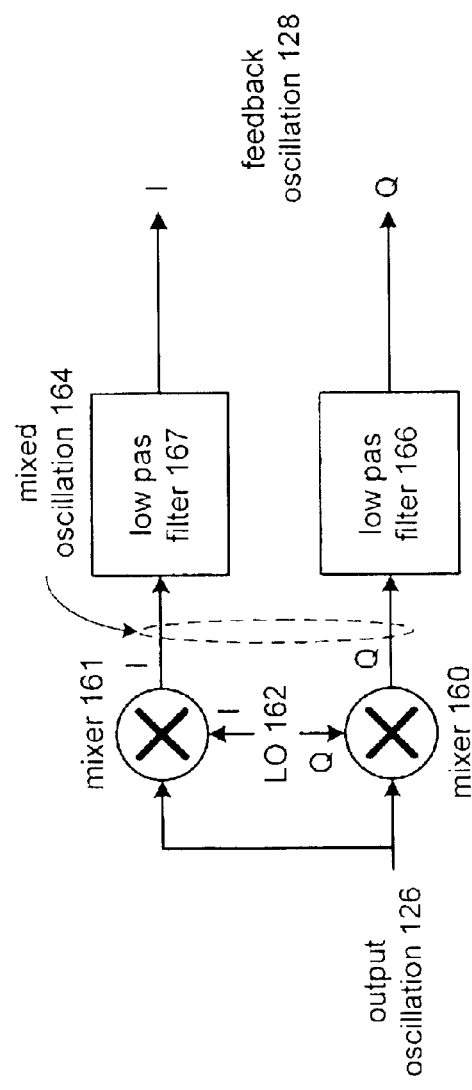
FIG. 10 is a schematic block diagram of another embodiment of a frequency translation module in accordance with the present invention.

FIG. 10 is a schematic block diagram of yet another embodiment of the frequency translation module 108. In this embodiment, the frequency translation module 108 includes mixers 160 and 161 and low pass filters 166 and 167. In this illustration, the frequency translation module is producing in-phase component and quadrature component of the feedback oscillation 128 based on the output oscillation 126 and an in-phase component and a quadrature component of the local oscillation 162. Accordingly, the output of mixers 161 and 160, which may be single side-band mixers, correspond to the in-phase and quadrature components of the mixed oscillation 164. The low pass filters 166 and 167 filter the in-phase and quadrature components generated by the mixers to produce the in-phase (I) component and the quadrature (Q) component of the feedback oscillation 128.

FIG. 11 illustrates a graphical representation of one means for adjusting the operating parameters of the controlled oscillation module, which may be a voltage controlled oscillator. In this illustration, the output frequency is plotted on the Y axis while the controlled voltage is plotted on the X axis. By limiting the range of the controlled voltage, which may be done by utilizing a voltage clamp on the input of the voltage controlled oscillator, the range of the resulting output frequencies of the VCO can be controlled to avoid false locking at the image frequency. The particular settings for the minimum control voltage is set at a value such that when the output oscillation reaches the local oscillation frequency, the voltage controlled oscillator is in a full-on saturation mode.

Figure 17:
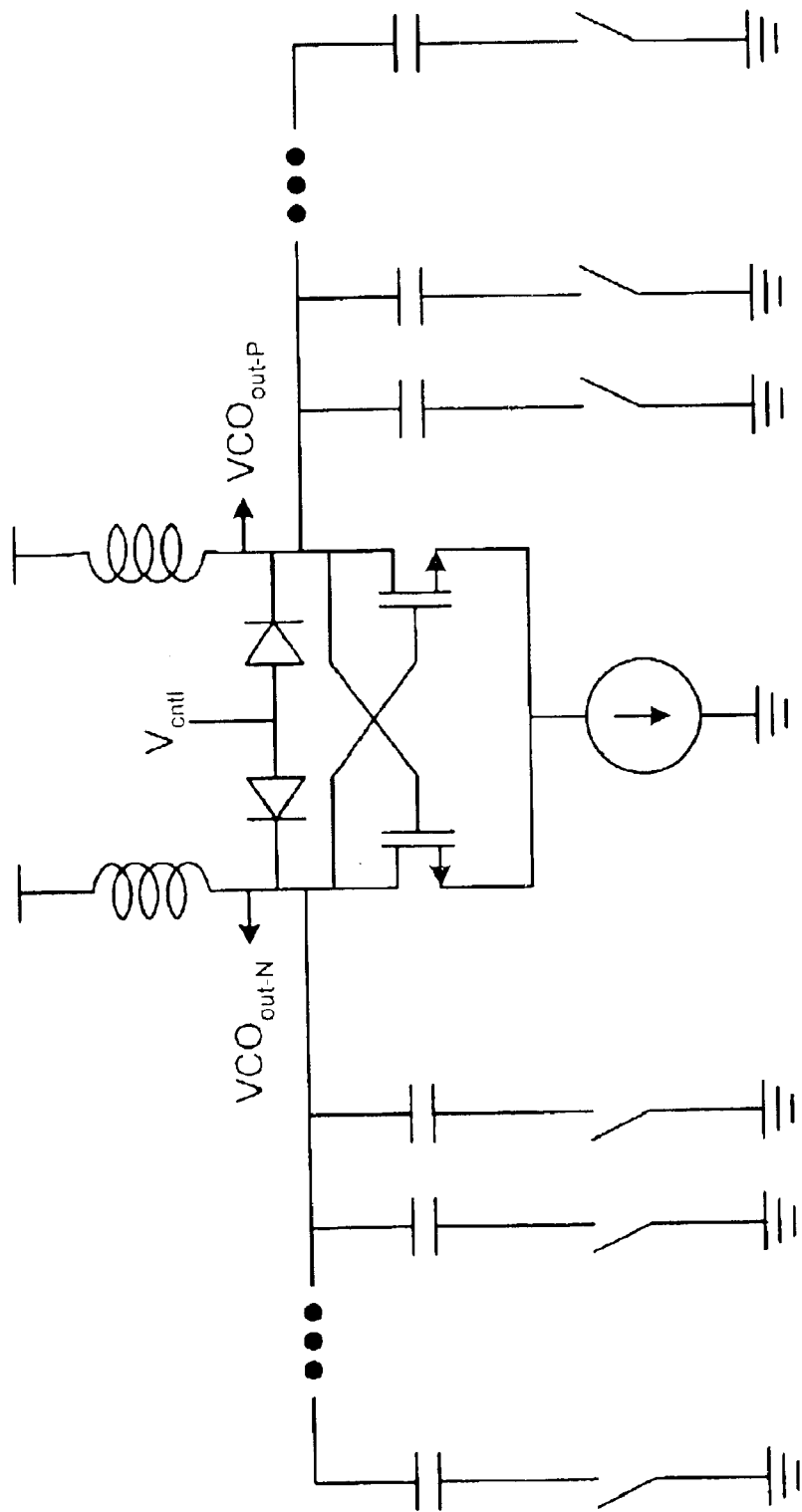
FIG. 17 is a schematic block diagram of a voltage controlled oscillator in accordance with the present invention.
Figure 18:
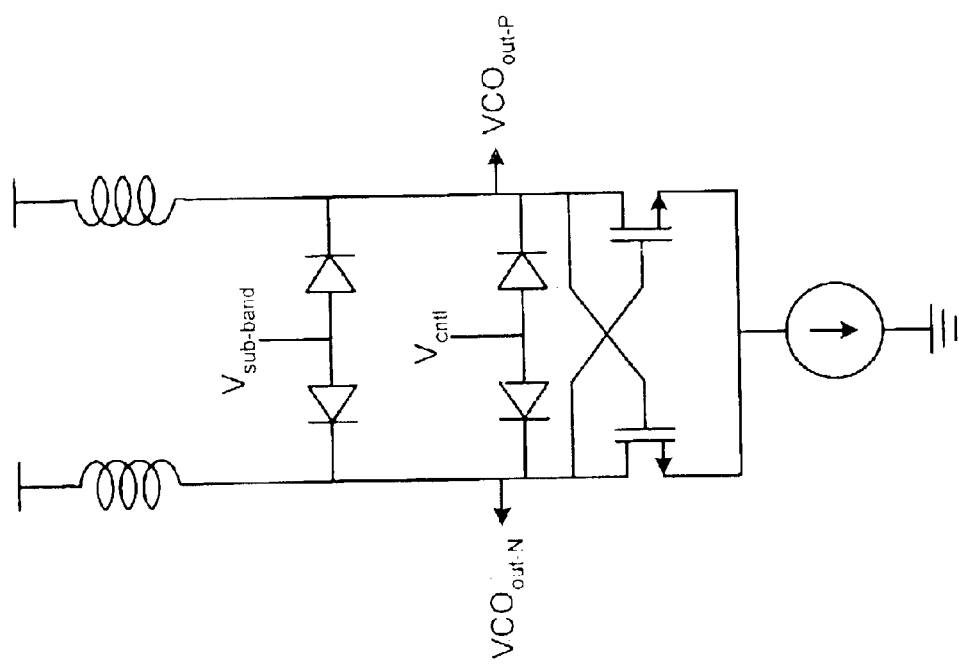
FIG. 18 is a schematic block diagram of another voltage controlled oscillator in accordance with the present invention.

FIG. 12 is a graphical representation of another means for adjusting the operating parameters of the controlled oscillator. In this embodiment, the gain of the voltage controlled oscillator is adjusted to avoid false locking at the image frequency. As such, the control voltage swings from its minimum to maximum value, but to avoid false locking at the image frequency, the gain of the corresponding VCO is adjusted such that at the minimum control voltage, the output frequency of the VCO is above the local oscillation frequency. As shown, there are some gain settings that are acceptable (i.e., the ones that correspond to the VCO output being above the local oscillation at the minimum control voltage) and some gain settings that are not acceptable (i.e., the ones that correspond to the VCO output being below the local oscillation at the minimum control voltage). The gain of the voltage controlled oscillator may be adjusted by utilizing switch capacitors that adjust the gain rate of the voltage controlled oscillator as shown in FIG. 17 or other means as shown in FIG. 18.

Figure 13:
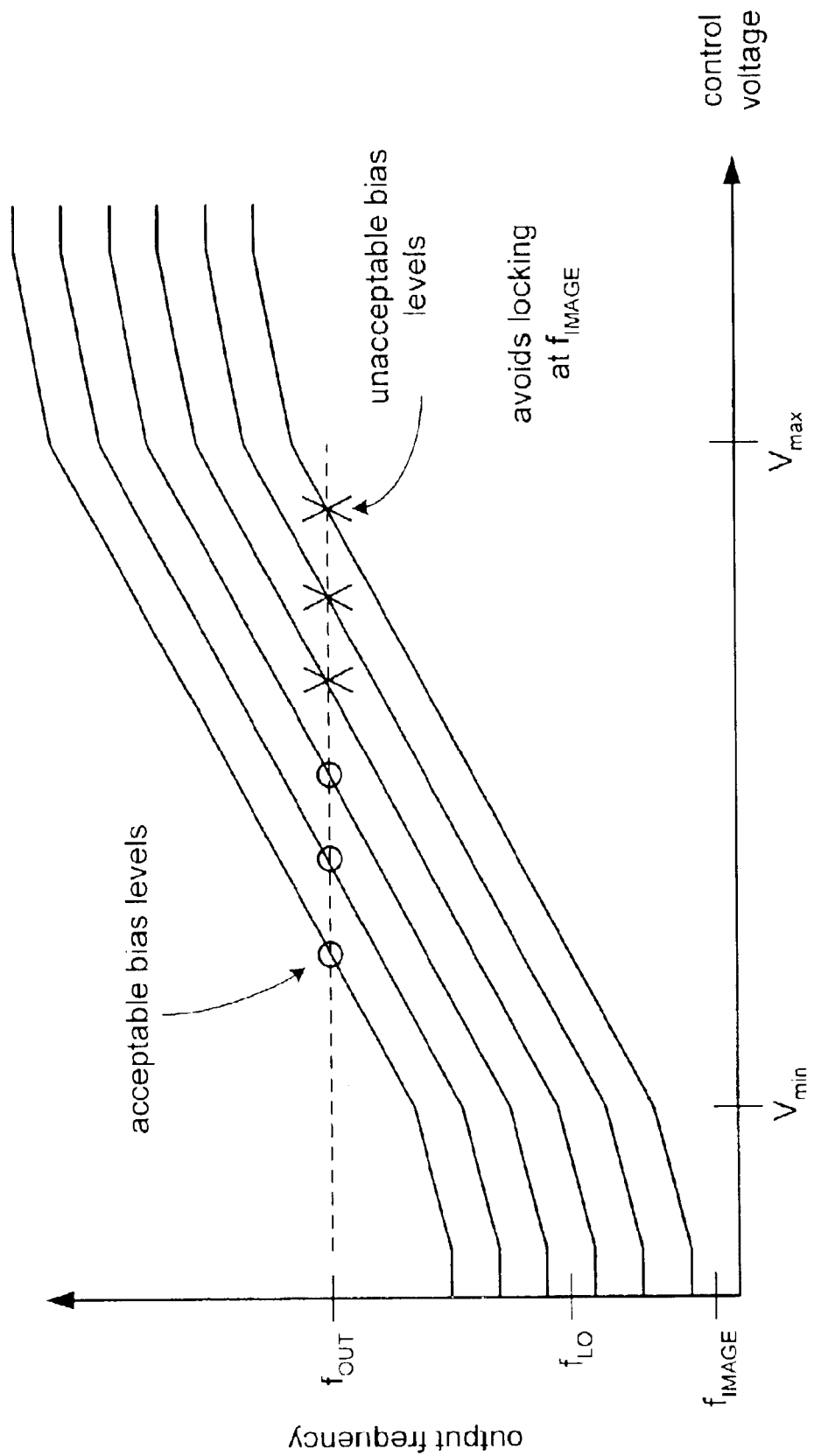
FIG. 13 is a graphical representation of adjusting a bias level of a voltage controlled oscillator to adjust the operating parameter in accordance with the present invention.

FIG. 13 is a graphical representation of another means for adjusting the operating parameters of the controlled oscillator. In this embodiment, the bias level of a voltage controlled oscillator is adjusted. As shown, the range of the control voltage is not adjusted nor is the gain. However, the bias level for a particular control voltage and corresponding output frequency is adjusted. As shown, various bias levels may be achieved where the intersection of the desired output frequency with the control voltage produces several curves that are within an acceptable range, (i.e., at the minimum control voltage) the output frequency is above the local oscillation frequency and further illustrates several bias levels that produce an unacceptable bias level since the output frequency at the minimum control voltage is at or below the local oscillation frequency. As one of average skill in the art will appreciate, the bias level of the voltage controlled oscillator may be adjusted utilizing switch capacitors, resistors and/or may include a verification module that counts pulses of the voltage controlled oscillator with respect to the desired frequency pulse to set the corresponding curve. Various embodiments of the VCO are shown in FIGS. 17 and 18.

Figure 14:
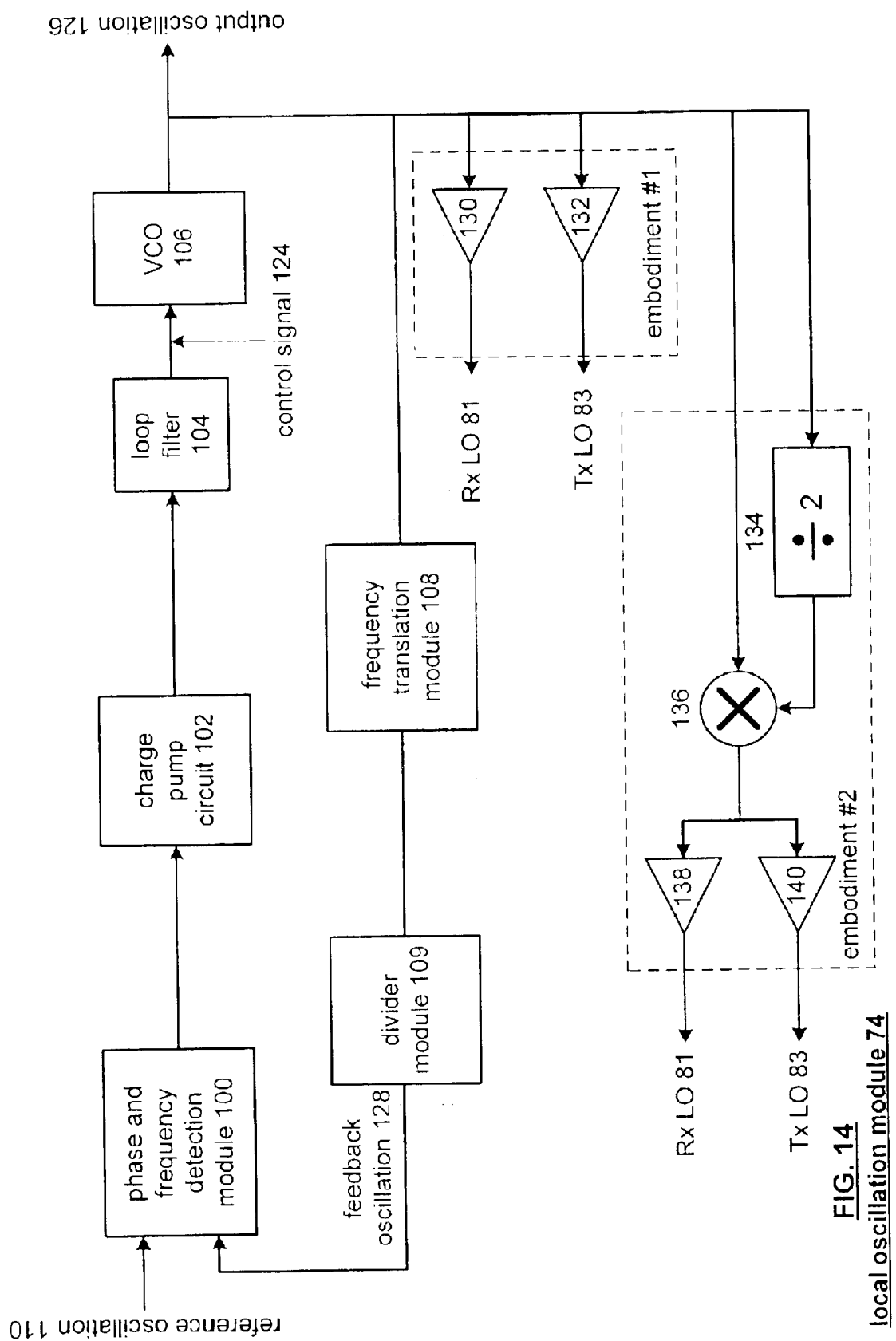
FIG. 14 is a schematic block diagram of an alternate embodiment of a local oscillation module in accordance with the present invention.

FIG. 14 is a schematic block diagram of an alternate embodiment of local oscillation module 74. In this embodiment, the local oscillation module 74 includes the phase and frequency detection module 100, the charge pump circuit 102, the loop filter 104, voltage controlled oscillator 106, frequency translation module 108 and divider module 109. The generation of the receiver section and transmitter section local oscillations are as previously described with reference to FIG. 7.

In this embodiment, the phase and frequency detection module 100, charge pump circuit 102 and loop filter 104 operate as previously discussed with reference to FIG. 7 to produce the control signal 124. In this embodiment, however, the voltage controlled oscillator 106 does not have its operating parameters adjusted. Accordingly, based on a particular setting of the voltage controlled oscillator 106, the voltage controlled oscillator 106 generates the output oscillation 126 based on the control signal 124.

Figure 1:
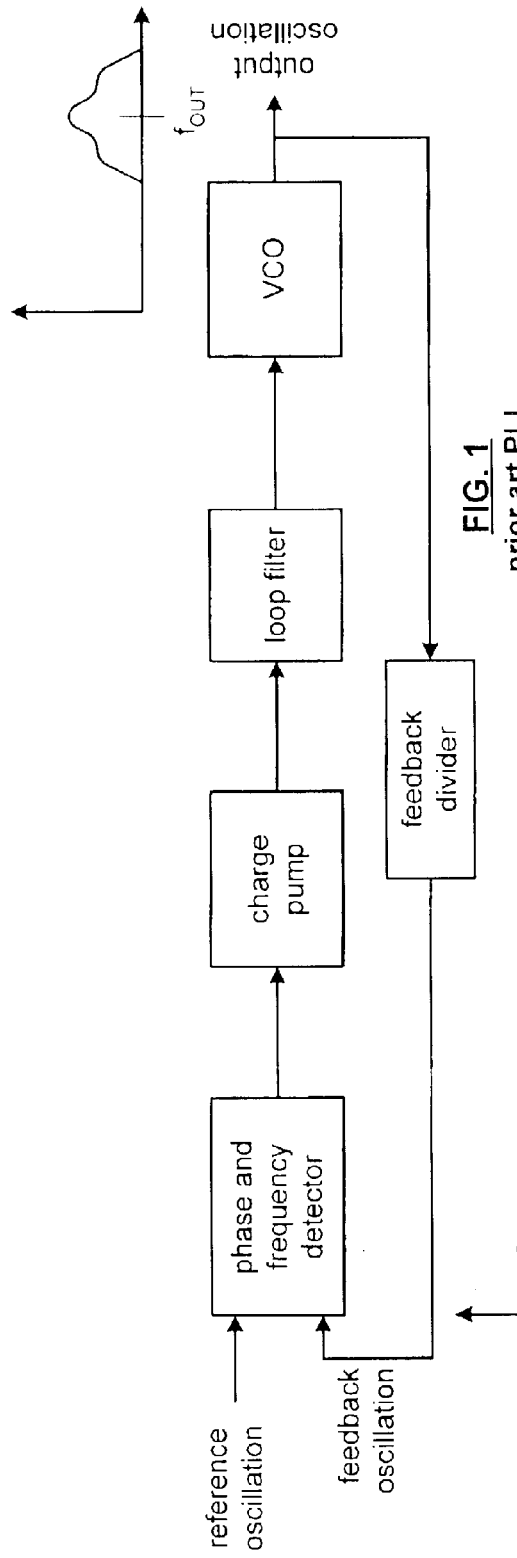
FIG. 1 is a schematic block diagram of a prior art phase locked loop.
Figure 2:
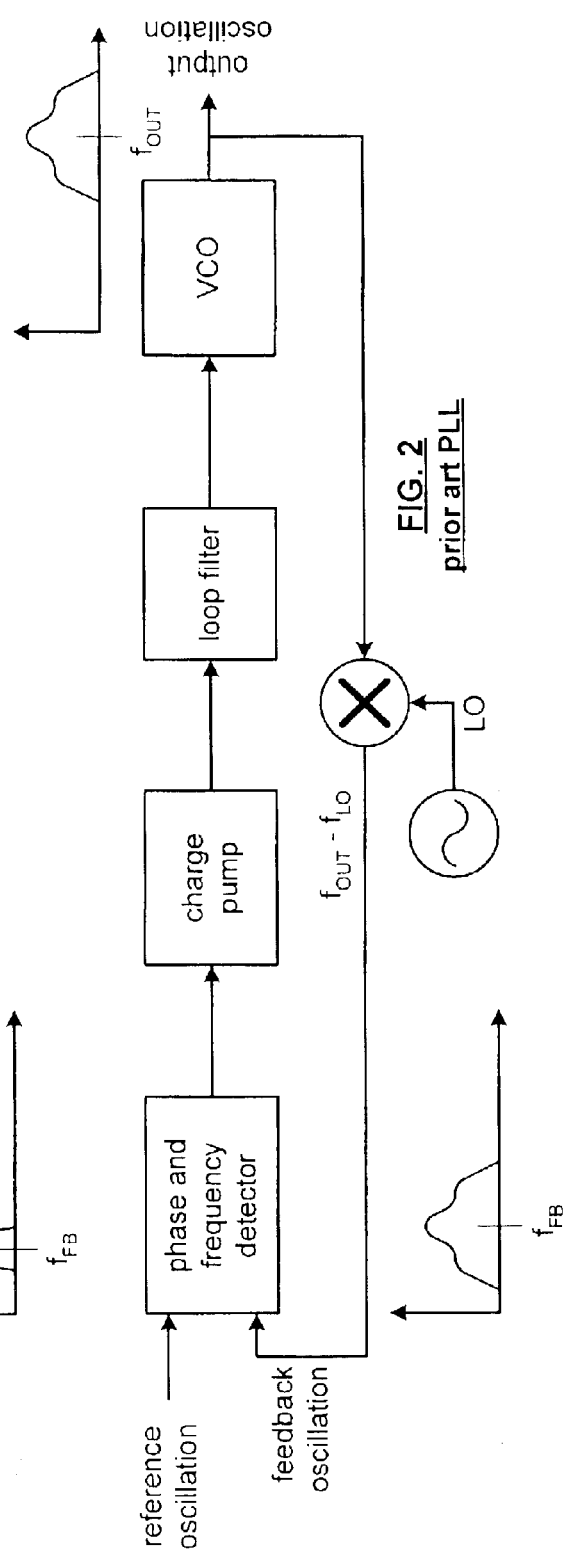
FIG. 2 is a schematic block diagram of an alternate prior art phase locked loop.
Figure 3:
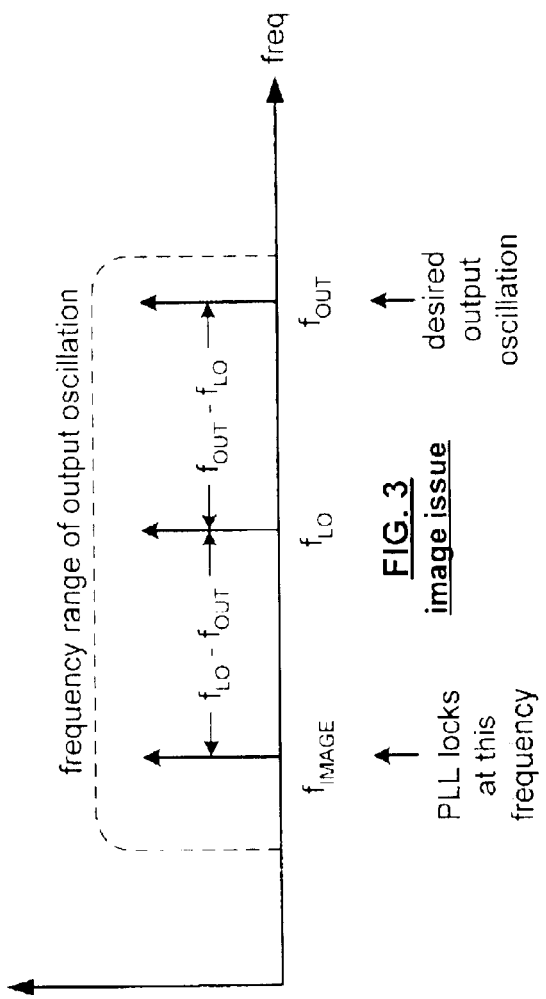
FIG. 3 is a schematic block diagram of false locking of the phase locked loop of FIG. 2.
Figure 4:
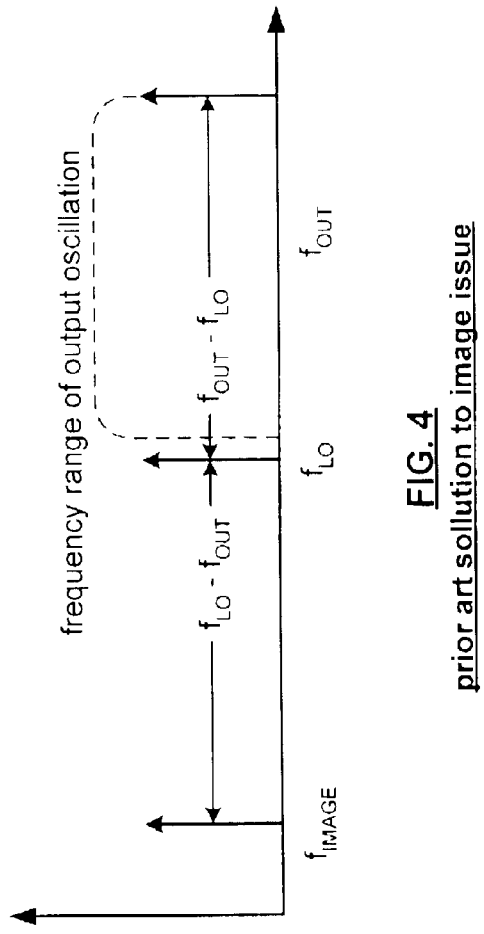
FIG. 4 is a diagram of a prior art solution to the false locking of the phase locked loop of FIG. 2.

The frequency translation module 108, which may be implemented as shown in FIGS. 8–10, converts the output oscillation into an intermediate feedback oscillation, wherein the local oscillation used by the frequency translation module 108 is of a value that avoids false locking of the phase locked loop. The divider module 109 divides the intermediate feedback oscillation to produce the feedback oscillation 128. Accordingly, the reference oscillation 110 may remain a commercially viable crystal oscillator that produces a 10–25 megahertz signal. While the divider module 108 does reduce the spectrum of the frequency oscillation 128, its divider value is relatively small with respect to the overall division of the output oscillation 126 to produce the feedback oscillation 128. As such, loss of zero crossings and the corresponding inaccuracies of the phase and frequency detection module as previously discussed with reference to the prior art embodiment of FIG. 1 are substantially avoided. Further, by utilizing a combination of the frequency translation module 108 and divider module 109, the false image locking of the prior art embodiment of FIG. 2 is also avoided. As one of average skill in the art will appreciate, the series connection of the frequency translation module 108 and divider module 109 may be flipped and still achieve the desired results.

Figure 15:
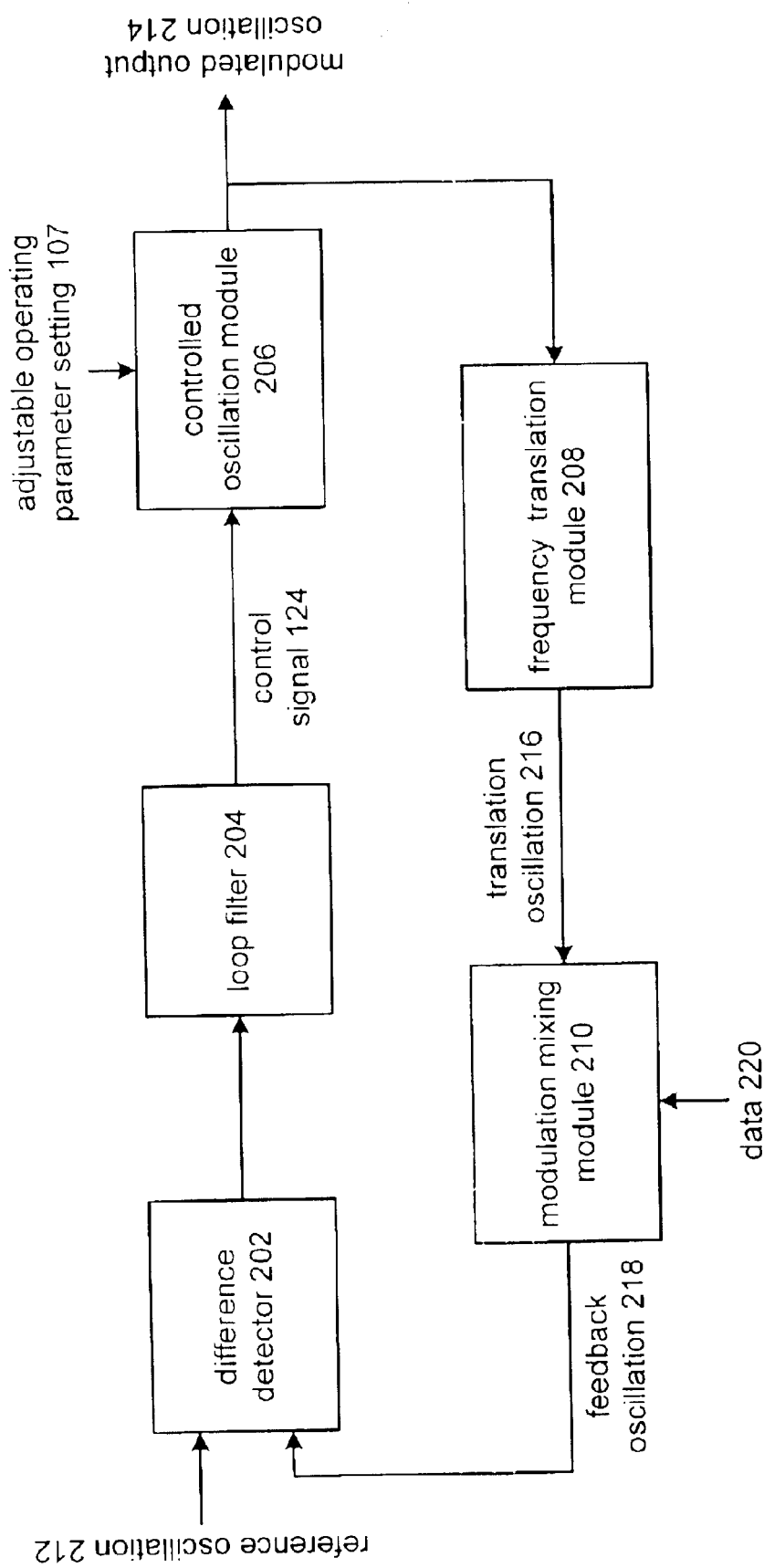
FIG. 15 is a schematic block diagram of a phase shift keying (PSK) modulator in accordance with the present invention.

FIG. 15 is a schematic block diagram of a phase shift keying modulator 200 that may be used in the wireless communication device of FIG. 6. The phase shift keying modulator 200 includes a difference detector 202, a loop filter 204, controlled oscillation module 206, frequency translation module 208 and mixing module 210. The difference detector 202 detects a phase and/or frequency difference between a reference oscillation 212 and a feedback oscillation 218. A crystal oscillator that generates a 10–25 megahertz oscillation may provide the reference oscillation 212. The loop filter receives the difference signal and converts it into a control signal 124. The controlled oscillation module 206, which may be a voltage controlled oscillator or a current controlled oscillator, produces a modulated output oscillation 214 based on control signal 124 and on settings for its adjustable operating parameters.

The frequency translation module 208, which may be implemented as previously discussed with reference to FIGS. 8–10, produces a translation oscillation 216 based on the modulated output oscillation 224. The modulation mixing module 220 mixes data 220 with the translation oscillation 216 to produce the feedback oscillation 218. As such, by including the modulation mixing module 210, such that data 220 is injected into the phase locked loop architecture, the resulting modulated output oscillation 214 corresponds to a phase shift keying output. As one of average skill in the art will appreciate, the mixing module 210 may be coupled to the input of the difference detector 202 such that the data 220 is mixed with the reference oscillation 212. As one of average skill in the art will further appreciate, the controlled oscillation module 206 and frequency translation module 208 may be replaced by the corresponding elements in the local oscillation module 74 illustrated in FIG. 14.

Figure 16:
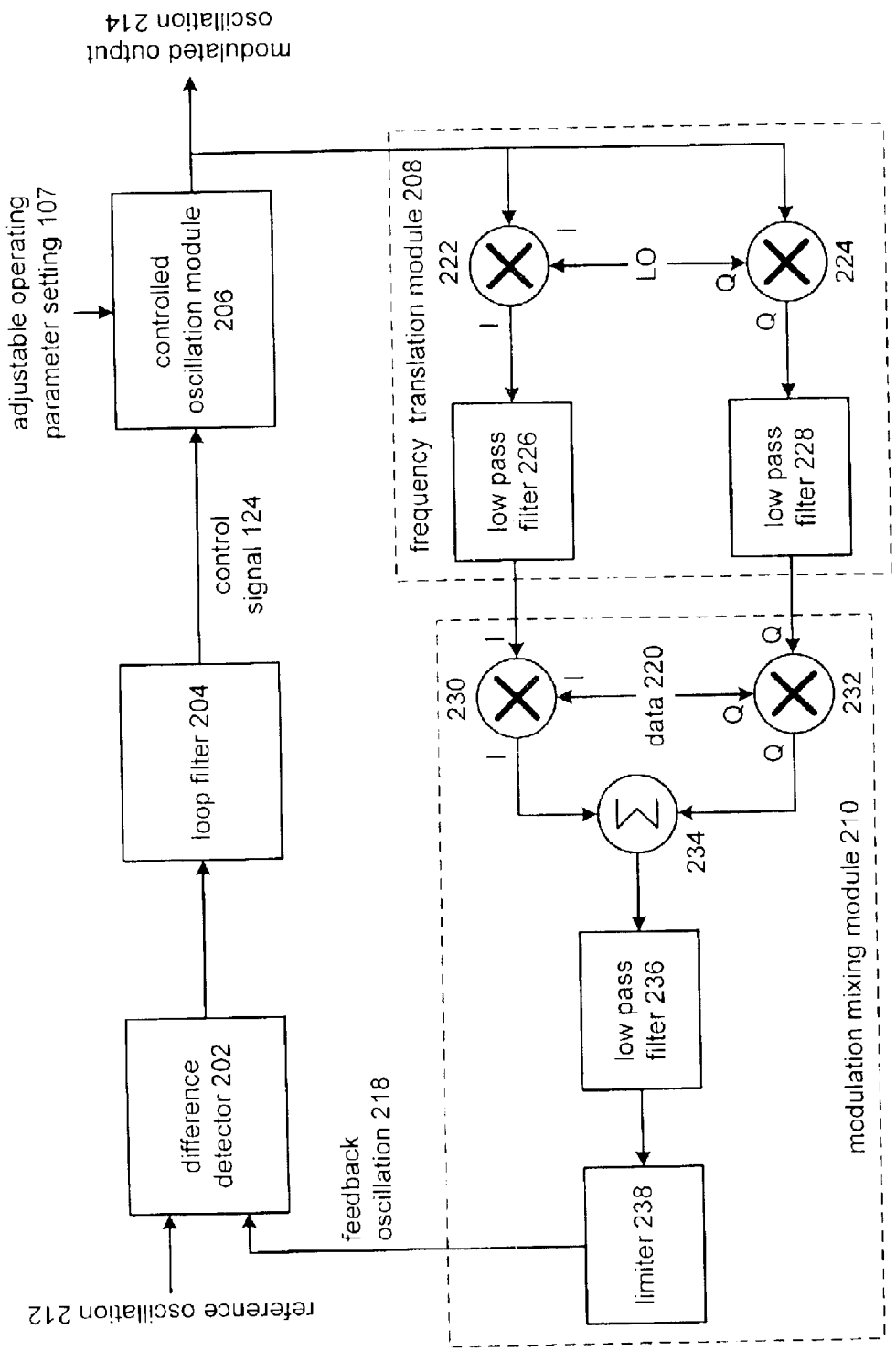
FIG. 16 is a schematic block diagram of an alternate embodiment of a PSK modulator in accordance with the present invention.

FIG. 16 illustrates a schematic block diagram of an alternate phase shift keying modulator 200. This embodiment includes a difference detector 202, the loop filter 204, the controlled oscillation module 206, the frequency translation module 208 and the modulation mixing module 210. The frequency translation module 208 includes a $1^{st}$ mixer 222, $2^{nd}$ mixer 224, $1^{st}$ low pass filter 226 and $2^{nd}$ low pass filter 228. The modulation mixing module 210 includes a $1^{st}$ mixer 230, a $2^{nd}$ mixer 232, a summing module 234, a low pass filter 236 and a limiter 238.

The functionality of the difference detector 202, loop filter 204 and controlled oscillation module 206 operate as previously discussed with reference to FIG. 15. The frequency translation module 208 mixes the modulated output oscillation 214 with an in-phase component of the local oscillation to produce an in-phase mixed signal. Mixer 224 mixes the modulated output oscillation 214 with the quadrature component of the local oscillation to produce a quadrature mixed signal. Low pass filter 226 and 228 filter the corresponding mixed signals.

The modulation mixing module 210 has the $1^{st}$ mixer 230 mixing the in-phase mixed signal with the in-phase component of data 220 while the $2^{nd}$ mixer 222 mixes the quadrature mixed signal with the quadrature component of data 220. The resulting mixed signals are summed via summer 234 to produce a modulated signal. The modulated signal is low pass filtered via filter 236 and subsequently limited by limiter 238 to produce the feedback oscillation 218.

FIG. 17 is a schematic block diagram of an embodiment of the voltage controlled oscillator (VCO) 106 and/or 206. In this embodiment, the center frequency of the VCO may be digitally adjusted via the switch capacitors. Accordingly, by changing the capacitance, the resonant frequency of the VCO changes, thus changing the range of frequencies it covers. To adjust the bias level of the VCO, level shifting transistors may be coupled in series with the switching transistors, such that, by adjusting the gate voltage of the level shifting transistors, the bias level of the VCO is changed.

FIG. 18 is a schematic block diagram of another embodiment of VCO 106 and/or 206. In this embodiment, the center frequency is adjusted in an analog mode via an analog sub-band selection voltage ($V_{sub-band}$). Accordingly, by changing the sub-band selection voltage the operating parameters of the VCO are changed. It is possible to combine the two varactor pairs of FIG. 18 into a single pair where, to adjust the bias level of the VCO, the control voltage is composed of $V_{cntrl}+V_{sub-band}$. The $V_{sub-band}$ part changes the bias level of the VCO.

The preceding discussion has presented various embodiments of a phase locked loop and applications thereof to avoid false locking of a phase locked loop, while maintaining the ability to use more conventional circuitry. As one of average skill in the art will appreciate, other embodiments may be derived from the teaching of the present invention without deviating from the scope of the claims.

What is claimed is:

1. A phase locked loop (PLL) comprises:
   difference detector operably coupled to determine a difference signal between a feedback oscillation and a reference oscillation;
   loop filter operably coupled to produce a control signal from the difference signal;
   controlled oscillation module operably coupled to produce, in accordance with an adjustable operating parameter of the controlled oscillation module, an output oscillation based on the control signal, wherein the adjustable operating parameter is set based on desired operating conditions of the PLL such that false locking of the PLL is substantially avoided; and
   frequency translation module operably coupled to produce the feedback oscillation from the output oscillation based on a frequency translation rate.

2. The PLL of claim 1, wherein the frequency translation module further comprises:
   sampling module operably coupled to produce a convolution of the output oscillation by sampling the output oscillation at a sampling rate, wherein the sampling rate corresponds to the frequency translation rate; and
   low pass filter operably coupled to filter the convolution of the output oscillation to produce the feedback oscillation.

3. The PLL of claim 1, wherein the frequency translation module further comprises:
   at least one mixer operably coupled to mix the output oscillation with a local oscillation to produce a mixed oscillation, wherein the local oscillation corresponds to the frequency translation rate; and
   at least one low pass filter operably coupled to filter the mixed oscillation to produce the feedback oscillation.

4. The PLL of claim 3, wherein the frequency translation module further comprises:
   first mixer operably coupled to mix an in-phase component of the output oscillation with an in-phase component of the local oscillation to produce an in-phase component of the mixed oscillation;
   second mixer operably coupled to mix a quadrature component of the output oscillation with a quadrature component of the local oscillation to produce a quadrature component of the mixed signal;
   first low pass filter operably coupled to filter the in-phase component of the mixed oscillation to produce an in-phase component of the feedback oscillation; and
   second low pass filter operably coupled to filter the quadrature component of the mixed oscillation to produce a quadrature component of the feedback oscillation.

5. The PLL of claim 3, wherein the controlled oscillation module further comprises:
   a voltage controlled oscillator (VCO), wherein range of the control signal, as the adjustable operating parameter, is limited based on a desired ratio between the reference oscillation and a difference between the output oscillation and the local oscillation such that the false locking of the PLL is substantially avoided.

6. The PLL of claim 3, wherein the controlled oscillation module further comprises:
   a voltage controlled oscillator (VCO), wherein gain of the VCO, as the adjustable operating parameter, is limited based on a desired ratio between the reference oscillation and a difference between the output oscillation and the local oscillation such that the false locking of the PLL is substantially avoided.

7. The PLL of claim 3, wherein the controlled oscillation module further comprises:
a voltage controlled oscillator (VCO), wherein a steady-state bias level of the VCO, as the adjustable operating parameter, is adjusted based on a desired ratio between the reference oscillation and a difference between the output oscillation and the local oscillation such that the false locking of the PLL is substantially avoided.

8. The PLL of claim 3, wherein the frequency translation module further comprises:
at least one modulation mixer operably coupled to mix data with the feedback oscillation to produce a phase shift keying (PSK) feedback oscillation, wherein the PSK feedback oscillation is provide to the difference detector as the feedback oscillation.

9. A phase locked loop (PLL) comprises:
difference detector operably coupled to determined a difference signal between a feedback oscillation and a reference oscillation;
loop filter operably coupled to produce a control signal from the difference signal;
controlled oscillation module operably coupled to produce an output oscillation based on the control signal;
frequency translation module; and
divider module operably coupled in series with the frequency translation module, wherein the series combination of the divider module and the frequency translation module is operably coupled to produce an intermediate feedback oscillation from the output oscillation and to produce the feedback oscillation from the intermediate feedback oscillation, wherein the intermediate feedback oscillation is of a frequency, with respect to the reference oscillation and the output oscillation, to substantially avoid false locking of the PLL.

10. The PLL of claim 9, wherein the series combination of the divider module and the frequency translation module further comprises:
the frequency translation module operably coupled to produce the intermediate feedback oscillation from the output oscillation based on a frequency translation rate; and
the divider module operably coupled to divide the intermediate feedback oscillation by a divider value to produce the feedback oscillation.

11. The PLL of claim 9, wherein the series combination of the divider module and the frequency translation module further comprises:
the divider module operably coupled to divide the output oscillation by a divider value to produce the intermediate feedback oscillation; and
the frequency translation module operably coupled to produce the feedback oscillation from the intermediate feedback oscillation based on a frequency translation rate.

12. The PLL of claim 9, wherein the frequency translation module further comprises:
sampling module operably coupled to produce a convolution of the output oscillation by sampling the output oscillation at a sampling rate; and
low pass filter operably coupled to filter the convolution of the output oscillation to produce the feedback oscillation.

13. The PLL of claim 9, wherein the frequency translation module further comprises:
at least one mixer operably coupled to mix the output oscillation with a local oscillation to produce a mixed oscillation; and
at least one low pass filter operably coupled to filter the mixed oscillation to produce the feedback oscillation.

14. The PLL of claim 13, wherein the frequency translation module further comprises:
first mixer operably coupled to mix an in-phase component of the output oscillation with an in-phase component of the local oscillation to produce an in-phase component of the mixed oscillation;
second mixer operably coupled to mix a quadrature component of the output oscillation with a quadrature component of the local oscillation to produce a quadrature component of the mixed signal;
first low pass filter operably coupled to filter the in-phase component of the mixed oscillation to produce an in-phase component of the feedback oscillation; and
second low pass filter operably coupled to filter the quadrature component of the mixed oscillation to produce a quadrature component of the feedback oscillation.

15. The PLL of claim 13, wherein the frequency translation module further comprises:
at least one modulation mixer operably coupled to mix data with the feedback oscillation to produce a phase shift keying (PSK) feedback oscillation, wherein the PSK feedback oscillation is provide to the difference detector as the feedback oscillation.

16. A phase shift keying (PSK) modulator comprises:
difference detector operably coupled to determine a difference signal between a feedback oscillation and a reference oscillation;
loop filter operably coupled to produce a control signal from the difference signal;
controlled oscillation module operably coupled to produce, in accordance with an adjustable operating parameter of the controlled oscillation module, a modulated output oscillation based on the control signal, wherein the adjustable operating parameter is set based on desired operating conditions of the PSK modulator such that false locking of the PSK modulator is substantially avoided;
frequency translation module operably coupled to produce a translation oscillation from the modulated output oscillation based on a frequency translation rate; and
modulation mixing module operably coupled to mix data with the translation oscillation to produce the feedback oscillation.

17. The PSK modulator of claim 16, wherein the frequency translation module further comprises:
sampling module operably coupled to produce a convolution of the modulated output oscillation by sampling the modulated output oscillation at a sampling rate, wherein the sampling rate corresponds to the frequency translation rate; and
low pass filter operably coupled to filter the convolution of the modulated output oscillation to produce the feedback oscillation.

18. The PSK modulator of claim 16, wherein the frequency translation module further comprises:
at least one mixer operably coupled to mix the modulated output oscillation with a local oscillation to produce a mixed oscillation, wherein the local oscillation corresponds to the frequency translation rate; and at least one low pass filter operably coupled to filter the mixed oscillation to produce the feedback oscillation.

19. The PSK modulator of claim 18, wherein the frequency translation module further comprises:

first mixer operably coupled to mix an in-phase component of the modulated output oscillation with an in-phase component of the local oscillation to produce an in-phase component of the mixed oscillation;

second mixer operably coupled to mix a quadrature component of the modulated output oscillation with a quadrature component of the local oscillation to produce a quadrature component of the mixed signal;

first low pass filter operably coupled to filter the in-phase component of the mixed oscillation to produce an in-phase component of the feedback oscillation; and second low pass filter operably coupled to filter the quadrature component of the mixed oscillation to produce a quadrature component of the feedback oscillation.

20. The PSK modulator of claim 18, wherein the controlled oscillation module further comprises:

a voltage controlled oscillator (VCO), wherein range of the control signal, as the adjustable operating parameter, is limited based on a desired ratio between the reference oscillation and a difference between the modulated output oscillation and the local oscillation such that the false locking of the PLL is substantially avoided.

21. The PSK modulator of claim 18, wherein the controlled oscillation module further comprises:

a voltage controlled oscillator (VCO), wherein gain of the VCO, as the adjustable operating parameter, is limited based on a desired ratio between the reference oscillation and a difference between the modulated output oscillation and the local oscillation such that the false locking of the PLL is substantially avoided.

22. The PSK modulator of claim 18, wherein the controlled oscillation module further comprises:

a voltage controlled oscillator (VCO), wherein a steady-state bias level of the VCO, as the adjustable operating parameter, is adjusted based on a desired ratio between the reference oscillation and a difference between the modulated output oscillation and the local oscillation such that the false locking of the PLL is substantially avoided.

23. A phase shift keying (PSK) modulator comprises:

difference detector operably coupled to determine a difference signal between a feedback oscillation and a reference oscillation;

loop filter operably coupled to produce a control signal from the difference signal;

controlled oscillation module operably coupled to produce a modulated output oscillation based on the control signal;

frequency translation module;

divider module operably coupled in series with the frequency translation module, wherein the series combination of the divider module and the frequency translation module is operably coupled to produce an intermediate feedback oscillation from the modulated output oscillation and to produce a translation oscillation from the intermediate feedback oscillation, wherein the intermediate feedback oscillation is of a frequency, with respect to the reference oscillation and the modulated output oscillation, to substantially avoid false locking of the PLL; and modulation mixing module operably coupled to mix data with the translation oscillation to produce the feedback oscillation.

24. The PSK modulator of claim 23, wherein the series combination of the divider module and the frequency translation module further comprises:

the frequency translation module operably coupled to produce the intermediate feedback oscillation from the modulated output oscillation based on a frequency translation rate; and the divider module operably coupled to divide the intermediate feedback oscillation by a divider value to produce the feedback oscillation.

25. The PSK modulator of claim 23, wherein the series combination of the divider module and the frequency translation module further comprises:

the divider module operably coupled to divide the modulated output oscillation by a divider value to produce the intermediate feedback oscillation; and the frequency translation module operably coupled to produce the feedback oscillation from the intermediate feedback oscillation based on a frequency translation rate.

26. The PSK modulator of claim 23, wherein the frequency translation module further comprises:

sampling module operably coupled to produce a convolution of the modulated output oscillation by sampling the modulated output oscillation at a sampling rate; and low pass filter operably coupled to filter the convolution of the modulated output oscillation to produce the feedback oscillation.

27. The PSK modulator of claim 23, wherein the frequency translation module further comprises:

at least one mixer operably coupled to mix the modulated output oscillation with a local oscillation to produce a mixed oscillation; and at least one low pass filter operably coupled to filter the mixed oscillation to produce the feedback oscillation.

28. The PSK modulator of claim 27, wherein the frequency translation module further comprises:

first mixer operably coupled to mix an in-phase component of the modulated output oscillation with an in-phase component of the local oscillation to produce an in-phase component of the mixed oscillation;

second mixer operably coupled to mix a quadrature component of the modulated output oscillation with a quadrature component of the local oscillation to produce a quadrature component of the mixed signal;

first low pass filter operably coupled to filter the in-phase component of the mixed oscillation to produce an in-phase component of the feedback oscillation; and second low pass filter operably coupled to filter the quadrature component of the mixed oscillation to produce a quadrature component of the feedback oscillation.

29. A radio frequency integrated circuit (RFIC) comprises:

transmitter section operably coupled to convert outbound data into outbound radio frequency (RF) signals based on a transmitter local oscillation;

receiver section operably coupled to convert inbound RF signals into inbound data based on a receiver local oscillation; and local oscillator operably coupled to produce the transmitter local oscillation and the receiver local oscillation, wherein the local oscillator includes:
    difference detector operably coupled to determine a difference signal between a feedback oscillation and a reference oscillation;
    loop filter operably coupled to produce a control signal from the difference signal;
    controlled oscillation module operably coupled to produce, in accordance with an adjustable operating parameter of the controlled oscillation module, an output oscillation based on the control signal, wherein the adjustable operating parameter is set based on desired operating conditions of the PLL such that false locking of the PLL is substantially avoided; and
    frequency translation module operably coupled to produce the feedback oscillation from the output oscillation based on a frequency translation rate.

30. The RFIC of claim 29, wherein the frequency translation module further comprises:
    sampling module operably coupled to produce a convolution of the output oscillation by sampling the output oscillation at a sampling rate, wherein the sampling rate corresponds to the frequency translation rate; and
    low pass filter operably coupled to filter the convolution of the output oscillation to produce the feedback oscillation.

31. The RFIC of claim 29, wherein the frequency translation module further comprises:
    at least one mixer operably coupled to mix the output oscillation with a local oscillation to produce a mixed oscillation, wherein the local oscillation corresponds to the frequency translation rate; and
    at least one low pass filter operably coupled to filter the mixed oscillation to produce the feedback oscillation.

32. The RFIC of claim 31, wherein the frequency translation module further comprises:
    first mixer operably coupled to mix an in-phase component of the output oscillation with an in-phase component of the local oscillation to produce an in-phase component of the mixed oscillation;
    second mixer operably coupled to mix a quadrature component of the output oscillation with a quadrature component of the local oscillation to produce a quadrature component of the mixed signal;
    first low pass filter operably coupled to filter the in-phase component of the mixed oscillation to produce an in-phase component of the feedback oscillation; and
    second low pass filter operably coupled to filter the quadrature component of the mixed oscillation to produce a quadrature component of the feedback oscillation.

33. The RFIC of claim 31, wherein the controlled oscillation module further comprises:
    a voltage controlled oscillator (VCO), wherein range of the control signal, as the adjustable operating parameter, is limited based on a desired ratio between the reference oscillation and a difference between the output oscillation and the local oscillation such that the false locking of the PLL is substantially avoided.

34. The RFIC of claim 31, wherein the controlled oscillation module further comprises:
    a voltage controlled oscillator (VCO), wherein gain of the VCO, as the adjustable operating parameter, is limited based on a desired ratio between the reference oscillation and a difference between the output oscillation and the local oscillation such that the false locking of the PLL is substantially avoided.

35. The RFIC of claim 31, wherein the controlled oscillation module further comprises:
    a voltage controlled oscillator (VCO), wherein a steady-state bias level of the VCO, as the adjustable operating parameter, is adjusted based on a desired ratio between the reference oscillation and a difference between the output oscillation and the local oscillation such that the false locking of the PLL is substantially avoided.

36. A radio frequency integrated circuit (RFIC) comprises:
    transmitter section operably coupled to convert outbound data into outbound radio frequency (RF) signals based on a transmitter local oscillation;
    receiver section operably coupled to convert inbound RF signals into inbound data based on a receiver local oscillation; and
    local oscillator operably coupled to produce the transmitter local oscillation and the to receiver local oscillation, wherein the local oscillator includes:
        difference detector operably coupled to determine a difference signal between a feedback oscillation and a reference oscillation;
        loop filter operably coupled to produce a control signal from the difference signal;
        controlled oscillation module operably coupled to produce an output oscillation based on the control signal;
        frequency translation module; and
        divider module operably coupled in series with the frequency translation module, wherein the series combination of the divider module and the frequency translation module is operably coupled to produce an intermediate feedback oscillation from the output oscillation and to produce the feedback oscillation from the intermediate feedback oscillation, wherein the intermediate feedback oscillation is of a frequency, with respect to the reference oscillation and the output oscillation, to substantially avoid false locking of the PLL.

37. The RFIC of claim 36, wherein the series combination of the divider module and the frequency translation module further comprises:
    the frequency translation module operably coupled to produce the intermediate feedback oscillation from the output oscillation based on a frequency translation rate; and
    the divider module operably coupled to divide the intermediate feedback oscillation by a divider value to produce the feedback oscillation.

38. The RFIC of claim 36, wherein the series combination of the divider module and the frequency translation module farther comprises:
    the divider module operably coupled to divide the output oscillation by a divider value to produce the intermediate feedback oscillation; and
    the frequency translation module operably coupled to produce the feedback oscillation from the intermediate feedback oscillation based on a frequency translation rate.

39. The RFIC of claim 36, wherein the frequency translation module further comprises:
    sampling module operably coupled to produce a convolution of the output oscillation by sampling the output oscillation at a sampling rate; and low pass filter operably coupled to filter the convolution of the output oscillation to produce the feedback oscillation.

40. The RFIC of claim 36, wherein the frequency translation module further comprises:

at least one mixer operably coupled to mix the output oscillation with a local oscillation to produce a mixed oscillation; and at least one low pass filter operably coupled to filter the mixed oscillation to produce the feedback oscillation.

41. The RFIC of claim 40, wherein the frequency translation module further comprises:

first mixer operably coupled to mix an in-phase component of the output oscillation with an in-phase component of the local oscillation to produce an in-phase component of the mixed oscillation;

second mixer operably coupled to mix a quadrature component of the output oscillation with a quadrature component of the local oscillation to produce a quadrature component of the mixed signal;

first low pass filter operably coupled to filter the in-phase component of the mixed oscillation to produce an in-phase component of the feedback oscillation; and second low pass filter operably coupled to filter the quadrature component of the mixed oscillation to produce a quadrature component of the feedback oscillation.

42. The RFIC of claim 40, wherein the frequency translation module further comprises:

at least one modulation mixer operably coupled to mix data with the feedback oscillation to produce a phase shift keying (PSK) feedback oscillation, wherein the PSK feedback oscillation is provide to the difference detector as the feedback oscillation.

* * * * *